(12) United States Patent
Lee

(10) Patent No.: US 10,868,036 B2
(45) Date of Patent: Dec. 15, 2020

(54) METHOD OF MANUFACTURING A SEMICONDUCTOR DEVICE

(71) Applicant: SK hynix Inc., Icheon-si (KR)

(72) Inventor: Jin Won Lee, Seoul (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/407,936

(22) Filed: May 9, 2019

(65) Prior Publication Data

US 2020/0135754 A1   Apr. 30, 2020

(30) Foreign Application Priority Data

Oct. 25, 2018  (KR) .................. 10-2018-0128509

(51) Int. Cl.
| | | |
|---|---|---|
| *H01L 27/00* | (2006.01) | |
| *H01L 27/11582* | (2017.01) | |
| *H01L 27/11565* | (2017.01) | |
| *H01L 27/11573* | (2017.01) | |
| *H01L 27/1157* | (2017.01) | |
| *H01L 21/28* | (2006.01) | |

(52) U.S. Cl.
CPC .... *H01L 27/11582* (2013.01); *H01L 27/1157* (2013.01); *H01L 27/11565* (2013.01); *H01L 27/11573* (2013.01); *H01L 29/40117* (2019.08)

(58) Field of Classification Search
CPC .................. H01L 27/11582; H01L 29/402
See application file for complete search history.

(56) References Cited

U.S. PATENT DOCUMENTS

| | | | |
|---|---|---|---|
| 9,576,973 B2* | 2/2017 | Lee ................. | H01L 23/53257 |
| 9,859,293 B2* | 1/2018 | Lee ..................... | H01L 23/528 |
| 2016/0148946 A1* | 5/2016 | Hironaga .......... | H01L 27/11575 257/324 |
| 2016/0260735 A1* | 9/2016 | Lee .................... | H01L 21/768 |
| 2016/0322374 A1* | 11/2016 | Sano ................ | H01L 21/76805 |
| 2017/0148810 A1* | 5/2017 | Kai .................... | H01L 23/535 |
| 2018/0090512 A1* | 3/2018 | Kim .................. | H01L 21/283 |
| 2019/0244970 A1* | 8/2019 | Jung ................ | H01L 27/11565 |

FOREIGN PATENT DOCUMENTS

| | | |
|---|---|---|
| KR | 1020160106972 A | 9/2016 |
| KR | 1020200046830 A | 5/2020 |

* cited by examiner

*Primary Examiner* — Caridad Everhart
*Assistant Examiner* — Ankush K Singal
(74) *Attorney, Agent, or Firm* — William Park & Associates Ltd.

(57) ABSTRACT

Provided herein may be a method of manufacturing a semiconductor device including the step of replacing sacrificial layers of a stack with line patterns through slits that pass through the stack and have different depths.

15 Claims, 10 Drawing Sheets

METHOD OF MANUFACTURING A SEMICONDUCTOR DEVICE

CROSS-REFERENCE TO RELATED APPLICATION

The present application claims priority under 35 U.S.C. § 119(a) to Korean patent application number 10-2018-0128509, filed on Oct. 25, 2018, the entire disclosure of which is incorporated herein by reference in its entirety.

BACKGROUND

1. Technical Field

Various embodiments of the present disclosure generally relate to a method of manufacturing a semiconductor device, and more particularly, to a method of manufacturing a three-dimensional semiconductor memory device.

2. Related Art

Generally, semiconductor devices may include a memory cell array including a plurality of memory cells. Memory cell arrays may include memory cells which are arranged in various structures. To enhance the degree of integration of semiconductor devices, memory cells may be three-dimensionally arranged on a substrate. In manufacturing three-dimensional semiconductor devices, a stack formed by stacking a plurality of material layers may be used.

SUMMARY

An embodiment of the present disclosure may provide for a method of manufacturing a semiconductor device, including: forming a stack; forming a first slit penetrating from a top surface of the stack into the stack to a first depth, and a second slit penetrating from the top surface of the stack into the stack to a second depth; removing sacrificial layers of the stack through the first slit and the second slit that have different depths; and filling areas from which the sacrificial layers have been removed with line patterns separated from each other by the first slit and the second slit.

An embodiment of the present disclosure may provide for a method of manufacturing a semiconductor device, including: forming a first stack; forming a second stack over the first stack; forming slits passing through at least one of the first stack and the second stack such that a number of slits passing through the second stack is greater than a number of slits passing through the first stack; removing first sacrificial layers of the first stack and second sacrificial layers of the second stack through the slits; and filling areas from which the first sacrificial layers and the second sacrificial layers have been removed with line patterns through the slits.

DETAILED DESCRIPTION

Figure 1A:
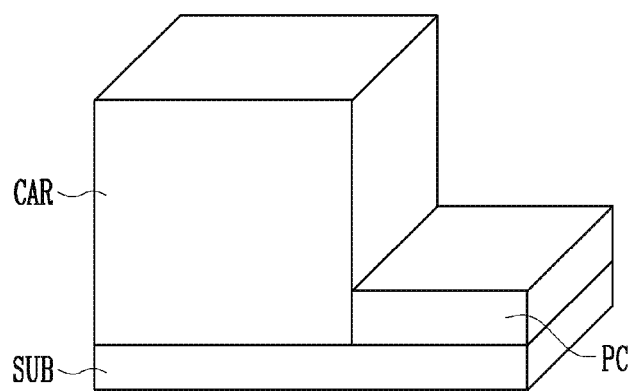
FIGS. 1A and 1B are block diagrams schematically illustrating semiconductor devices in accordance with embodiments.

Examples of embodiments will now be described hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the examples of embodiments to those skilled in the art.

In the drawing figures, dimensions may be exaggerated for clarity of illustration. It will be understood that when an element is referred to as being "between" two elements, it can be the only element between the two elements, or one or more intervening elements may also be present.

Hereinafter, embodiments will be described with reference to the accompanying drawings. Embodiments are described herein with reference to cross-sectional illustrations that are schematic illustrations of embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings denote like elements.

Terms such as "first" and "second" may be used to describe various components, but they should not limit the various components. Those terms are only used for the purpose of differentiating a component from other components. For example, a first component may be referred to as a second component, and a second component may be referred to as a first component and so forth without departing from the spirit and scope of the present disclosure. Furthermore, "and/or" may include any one of or a combination of the components mentioned.

Furthermore, a singular form may include a plural from as long as it is not specifically mentioned in a sentence. Furthermore, "include/comprise" or "including/comprising" used in the specification represents that one or more components, steps, operations, and elements exist or are added.

Furthermore, unless defined otherwise, all the terms used in this specification including technical and scientific terms have the same meanings as would be generally understood by those skilled in the related art. The terms defined in generally used dictionaries should be construed as having the same meanings as would be construed in the context of the related art, and unless clearly defined otherwise in this specification, should not be construed as having idealistic or overly formal meanings.

It is also noted that in this specification, "connected/coupled" refers to one component not only directly coupling another component but also indirectly coupling another component through an intermediate component. On the other hand, "directly connected/directly coupled" refers to one component directly coupling another component without an intermediate component.

Various embodiments of the present disclosure are directed to a method of manufacturing a semiconductor device capable of easily replacing sacrificial layers of a stack with line patterns.

Figure 1B:
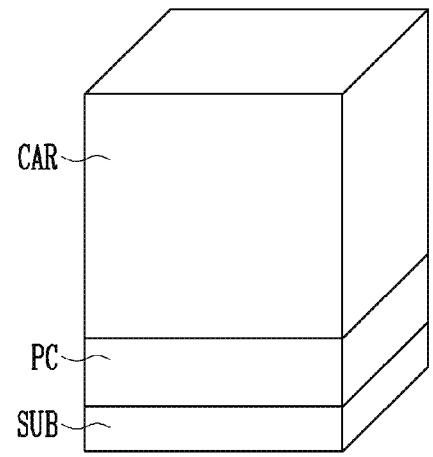

FIGS. 1A and 1B are block diagrams schematically illustrating semiconductor devices in accordance with embodiments.

Referring to FIGS. 1A and 1B, each of the semiconductor devices in accordance with the embodiments of the present disclosure may include a peripheral circuit structure PC and a cell array CAR which are disposed over a substrate SUB.

The substrate SUB may a single-crystal semiconductor layer. For example, the substrate SUB may a bulk silicon substrate, a silicon-on-insulator substrate, a germanium substrate, a germanium-on-insulator substrate, a silicon-germanium susbstrate, or a thin epitaxial layer formed by a selective epitaxial growth method.

The cell array CAR may include a plurality of memory blocks. Each of the memory blocks may include a plurality of cell strings. Each of the cell strings may be electrically coupled to a bit line, a source line, word lines, and select lines. Each of the cell strings may include memory cells and select transistors which are coupled in series to each other. Each of the select lines may be used as a gate electrode a select transistor corresponding thereto. Each of the word lines may be used as a gate electrode of a memory cell corresponding thereto.

The peripheral structure PC may include an NMOS transistor, a PMOS transistor, a resistor, and capacitor which are electrically coupled with the cell array CAR. The NMOS and PMOS transistors, the resistor, and the capacitor may be used as elements which form a row decoder, a column decoder, a page buffer, and a control circuit.

As illustrated in FIG. 1A, the peripheral circuit structure PC may be disposed on portion of the substrate SUB that does not overlap with the cell array CAR.

As illustrated in FIG. 1B, the peripheral circuit structure PC may be disposed between the cell array CAR and the substrate SUB. In an embodiment, since the peripheral circuit structure PC overlaps with the cell array CAR, a surface area of the substrate SUB that is required to install the cell array CAR and the peripheral structure PC may be reduced.

Figure 2:
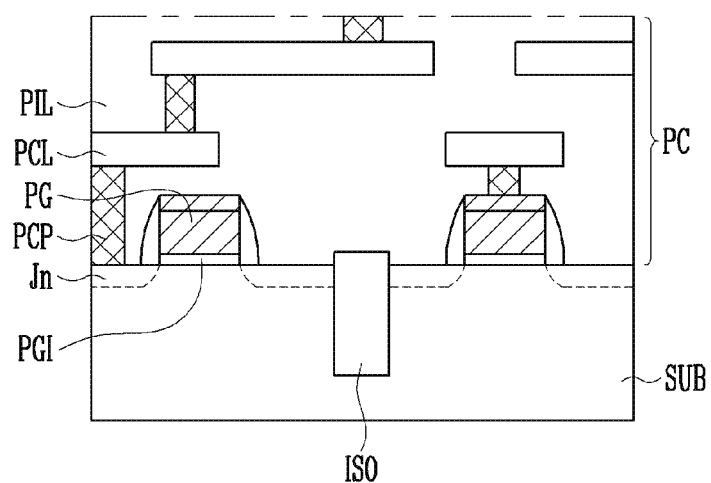
FIG. 2 is a sectional view schematically illustrating a peripheral structure in accordance with an embodiment.

FIG. 2 is a sectional view schematically illustrating a peripheral structure PC in accordance with an embodiment. The peripheral structure PC illustrated in FIG. 2 may be included in the peripheral structure illustrated in FIG. 1A or included in the peripheral structure illustrated in FIG. 1B.

Referring to FIG. 2, the peripheral structure PC may include peripheral gate electrodes PG, a peripheral gate insulating layer PGI, junctions jn, peripheral circuit lines PCL, and peripheral contact plugs PCP.

The peripheral gate electrodes PG may be used as gate electrodes of an NMOS transistor and a PMOS transistor of the peripheral circuit structure PC. The peripheral gate insulating layer PGI may be disposed between each of the peripheral gate electrodes PG and the substrate SUB.

The junctions jn may be areas defined by injecting n-type or p-type impurities into an active area of the substrate SUB, and may be disposed on opposite sides of each of the peripheral gate electrodes PG and used as a source junction and a drain junction. The active area of the substrate SUB may be partitioned by an isolation layer ISO that is formed in the substrate SUB. The isolation layer ISP may be formed of insulating material.

The peripheral circuit lines PCL may be electrically coupled to a circuit of the peripheral circuit structure PC through the peripheral contact plugs PCP.

A peripheral circuit insulating layer PIL may cover the circuit of the peripheral circuit structure PC, the peripheral circuit lines PCL, and the peripheral contact plugs PCP. The peripheral circuit insulating layer PIL may include insulating layers that are stacked in a multilayer structure.

Figure 3A:
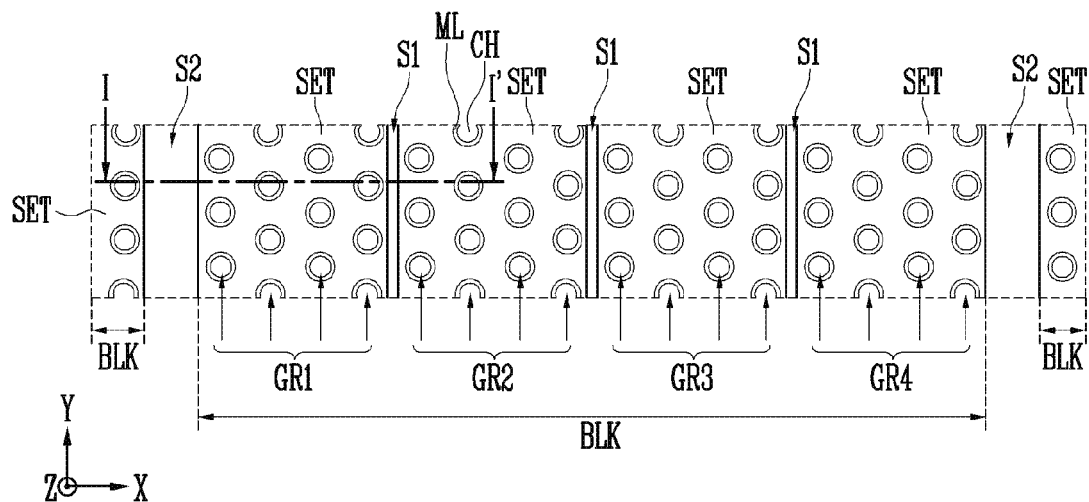
FIGS. 3A and 3B are plan views illustrating a layout of a semiconductor device in accordance with an embodiment.
Figure 3B:
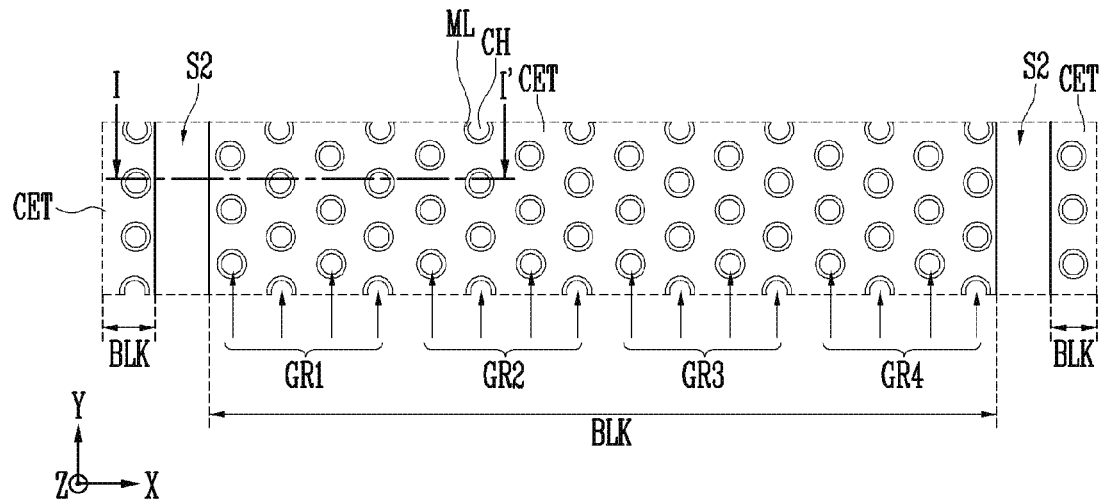

FIGS. 3A and 3B are plan views illustrating a layout of a semiconductor device in accordance with an embodiment. Each of the structures illustrated in FIGS. 3A and 3B may be included in the cell array CAR illustrated in FIG. 1A or 1B.

Referring to FIGS. 3A and 3B, the semiconductor device in accordance with an embodiment may include select stacks SET and cell stacks CET. FIG. 3A illustrates a layout of the select stacks SET, and FIG. 3B illustrates a layout of the cell stacks CET. The select stacks SET illustrated in FIG. 3A may be disposed over or under the cell stacks CET illustrated in FIG. 3B.

The select stacks SET and the cell stacks CET may form memory blocks BLK. Each of the memory blocks BLK may include at least one cell stack CET and two or more select stacks SET.

The select stacks SET may be separated from each other by first slits S1 and second slits S2. At least one first slit S1 may be formed between the second slits S2 that are adjacent to each other in a first horizontal direction X. For example, one first slit S1 may be formed between the second slits S2 that are adjacent to each other in the first horizontal direction X. Alternatively, two or more first slits S1 arranged in the first horizontal direction X may be formed between the second slits S2 that are adjacent to each other. The second slits S2 may be formed in respective boundaries between the memory blocks BLK.

The second slits S2 may extend into spaces between the cell stacks CET. Each of the cell stacks CET may extend in the first horizontal direction X between the second slit S2 that are adjacent to each other, and may overlap with at least one of the first slits S1.

Each of the select stacks SET and the cell stacks CET may extend in the first horizontal direction X and a second horizontal direction Y that intersect with each other. Each of the select stacks SET and the cell stacks CET may include line patterns which are stacked in a first direction Z. The first direction Z may be a direction which perpendicularly intersects with the first horizontal direction X and the second horizontal direction Y. The line patterns may include interlayer insulating layers and conductive patterns. A stacked structure of the interlayer insulating layers and the conductive patterns will be described below with reference to FIG. 4A.

Each of the first slits S1 and the second slits S2 may extend in the second horizontal direction Y. Channel structures CH may be disposed on opposite sides of each of the second slits S2. Each of the channel structures CH may extend in the first direction Z and pass through the select stacks SET and the cell stacks CET. The channel structures CH disposed between the second slits S2 that are adjacent to each other may be divided into a plurality of channel groups (e.g., GR1 to GR4) by the first slits S1. In other words, each of the memory blocks BLK may include two or more channel groups GR1 to GR4 which are shared by the cell stack CET corresponding to one of the memory blocks BLK. The channel groups GR1 to GR4 that are shared by the single cell stack CET may be individually controlled by the respective select stacks SET that are separated from each other by at least one first slit S1. Each channel group GR1, GR2, GR3, or GR4 may include one or more rows of channel structures CH. In an embodiment, sixteen rows of channel structures CH may be disposed between the second slits S2 that are adjacent to each other. In other embodiments, more or fewer rows of channel structures CH than the sixteen rows may be disposed between the second slits S2 that are adjacent to each other.

According to the above-mentioned structure, the number of channel structures CH that are shared by each select stack SET may be less than the number of channel structures CH that are shared by each cell stack CET.

Each of the first slits S1 and the second slits S2 may linearly extend in the second horizontal direction Y. However, the present disclosure is not limited thereto. In an embodiment, each of the first slits S1 may be formed in a zigzag shape. In an embodiment, each of the first slits S1 may be formed in a wavy shape.

The width of each first slit S1 may differ from that of each second slit S2. For example, each first slit S1 may be narrower than each second slit S2 with respect to the first horizontal direction X.

The channel structures CH may be arranged in a zigzag fashion. However, the present disclosure is not limited thereto. In an embodiment, the channel structures CH may be arranged parallel to each other in the first horizontal direction X and the second horizontal direction Y. A multilayer layer ML may be disposed between each channel structure CH and the corresponding cell stack CET. The multilayer layer ML may extend into a space between the channel structure CH and the corresponding select stack SET.

Figure 4A:
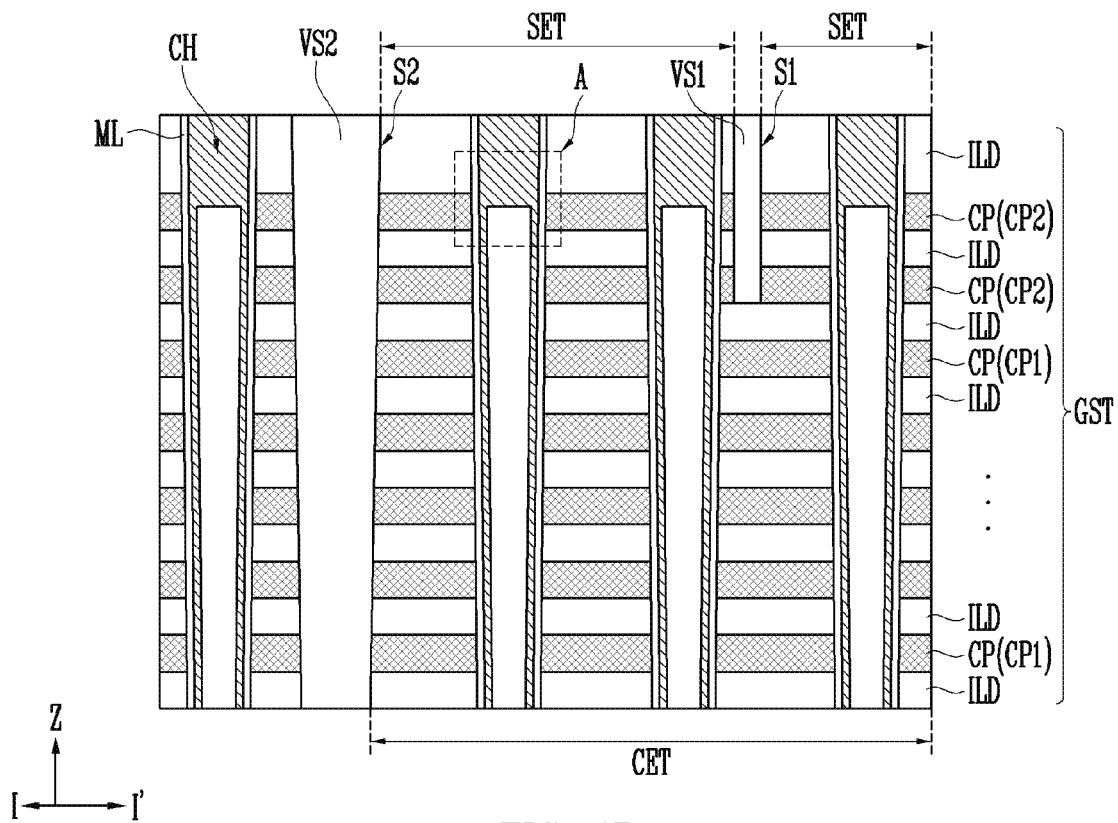
FIGS. 4A and 4B are sectional views illustrating the semiconductor device in accordance with an embodiment.
Figure 4B:
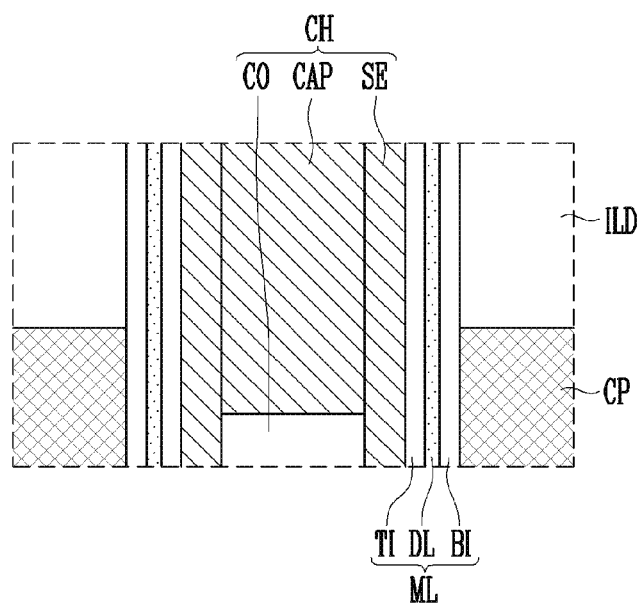

FIGS. 4A and 4B are sectional views illustrating the semiconductor device in accordance with an embodiment.

FIG. 4A illustrates a stacked structure of the select stacks SET illustrated in FIG. 3A and the cell stacks CET illustrated in FIG. 3B. FIG. 4A is a sectional view of a memory block taken along line I-I' illustrated in each of FIGS. 3A and 3B. Although the following drawings illustrate the case where the select stacks SET are disposed over the cell stacks CET, the present disclosure is not limited thereto. In an embodiment, the select stacks SET may be disposed under the cell stacks CET.

Referring to FIG. 4A, the semiconductor device in accordance with an embodiment may include a gate stack GST. The gate stack GST may include interlayer insulating layers ILD and conductive patterns CP which are alternately stacked in the first direction Z. Each of the interlayer insulating layers ILD and the conductive patterns CP may be a line pattern which extends in the second horizontal direction Y illustrated in FIGS. 3A and 3B.

The gate stack GST may include a cell stack CET and select stacks SET which are stacked on the cell stack CET and spaced apart from each other in the horizontal direction. In other words, the interlayer insulating layers ILD and the conductive patterns CP may be divided into patterns that form the cell stack CET, and patterns that form the select stacks SET.

The first slit S1 may be formed in the gate stack GST. The first slit S1 may separate the select stacks SET included in the gate stack GST from each other. A boundary of the gate stack GST may be defined by the second slit S2. The second slit S2 may extend in the first direction Z to define a sidewall of the cell stack CET. The second slits S2 may extend to a height at which the select stacks SET are disposed. Thus, the second slit S2 may define a sidewall of a side stack of the select stacks SET that is adjacent to the second slit S2.

The first slit S1 may be filled with a first vertical structure VS1. The second slit S2 may be filled with a second vertical structure VS2. The first vertical structure VS1 may include insulating material. The second vertical structure VS2 may include insulating material, or may include a vertical conductive pattern and an insulating layer which extends along a sidewall of the vertical conductive pattern.

The first slit S1 and the first vertical structure VS1 may pass through at least a pattern that is disposed in an uppermost layer among the conductive patterns CP of the gate stack GST. However, the present disclosure is not limited thereto. For example, the first slit S1 and the first vertical structure VS1 may pass through the pattern that is disposed in the uppermost layer and one or more patterns that are successively disposed under the uppermost pattern among the conductive patterns CP of the gate stack GST. Multiple patterns of the conductive patterns CP may extend to overlap with the first slit S1 and the first vertical structure VS1 rather than being penetrated by the first slit S1 and the first vertical structure VS1. The conductive patterns CP that are not penetrated by the first slit S1 and the first vertical structure VS1 may be defined as first patterns CP1. The conductive patterns CP that are penetrated by the first slit S1 and the first vertical structure VS1 and thus separated from each other may be defined as second patterns CP2. The second patterns CP2 may be defined by dividing the uppermost conductive pattern of the conductive patterns CP into two or more parts. Alternatively, the second patterns CP2 may be defined by dividing each of two or more conductive patterns that are successively disposed from the uppermost layer toward the first patterns CP1 among the conductive patterns CP into two or more parts.

Each of the first patterns CP1, the second patterns CP2, and the interlayer insulating layers ILD may surround the channel structures CH that passes through the gate stack GST. The multilayer layer ML may be disposed between each channel structure CH and the gate stack GST. The multilayer layer ML may extend along a sidewall of the corresponding channel structure CH. Embodiments of the present disclosure are not limited thereto. Although not illustrated, in an embodiment, the multilayer layer ML may be disposed on respective sidewalls of the conductive patterns CP that face the channel structures CH, and may extend along interfaces between each conductive pattern CP and the interlayer insulating layers ILD that are adjacent to the conductive pattern CP. In an embodiment, the multilayer layer ML may have a C-shaped cross-sectional structure which is open toward the first slit S1 or the second slit S2.

Each of the conductive patterns CP may include at least any one of a silicon layer, a metal silicide layer, a metal layer, and a metal nitride layer. To achieve low resistance wiring, each of the conductive patterns CP may include metal such as tungsten (W). In an embodiment, to prevent each of the conductive patterns CP from coming into direct contact with the corresponding adjacent interlayer insulating layers ILD or the multilayer layer ML, a barrier layer (not shown) may be further formed. The barrier layer may be formed of a metal nitride layer. For example, the barrier layer may include a titanium nitride layer, a tungsten nitride layer, or a tantalum nitride layer.

Each of the interlayer insulating layers ILD may be formed of various insulating materials. For example, each of the interlayer insulating layers ILD may include a silicon oxide layer.

FIG. 4B is an enlarged sectional view of portion A illustrated in FIG. 4A.

Referring to FIG. 4B, the channel structure CH may include a semiconductor layer SE. In an embodiment, the semiconductor layer SE may be formed of a silicon layer. The semiconductor layer SE may be conformally formed on an inner surface of the multilayer layer ML, or may be formed such that a central area of the multilayer layer ML is completely filled with the semiconductor layer SE.

As illustrated in FIG. 4B, in the case where the semiconductor layer SE is conformally formed on the inner surface of the multilayer layer ML, the channel structure CH may further include a core insulating layer CO and a capping pattern CAP with which a central area of the semiconductor layer SE is filled. The core insulating layer CO may have a height less than that of the semiconductor layer SE. The capping pattern CAP may be surrounded by an upper end of the semiconductor layer SE that further protrudes than the core insulating layer CO, and may be disposed on the core insulating layer CO. The capping pattern CAP comes into contact with the semiconductor layer SE. The capping pattern CAP may be formed of a semiconductor layer doped with impurities. In an embodiment, the capping pattern CAP may be formed of a doped silicon layer including n-type impurities.

The multilayer layer ML may extend along the sidewall of the channel structure CH. The multilayer layer ML may include a tunnel insulating layer TI to surround the channel structure CH, a data storage layer DL to surround the tunnel insulating layer TI, and a blocking insulating layer BI to surround the data storage layer DL.

The data storage layer DL may be formed of a charge trap layer, a material layer including conductive nanodots, or a phase-change material layer.

The data storage layer DL may store data to be changed using Fowler-Nordheim tunneling caused by a voltage difference between the channel structure CH and each of the first patterns CP1 that are used as word lines among the conductive patterns CP illustrated in FIG. 4A. To this end, the data storage layer DL may be formed of a silicon nitride layer capable of trapping charges.

The data storage layer DL may store data based on an operation principle other than the Fowler-Nordheim tunneling. For example, the data storage layer DL may be formed of a phase-change material layer and store data in response to a phase change.

The blocking insulating layer BI may include an oxide layer capable of blocking charges. The tunnel insulating layer TI may be formed of a silicon oxide layer making charge tunneling possible.

Illustrated in FIG. 4A, the multilayer layer ML between the select stack SET and the channel structure CH may be used as a gate insulating layer.

Figure 5A:
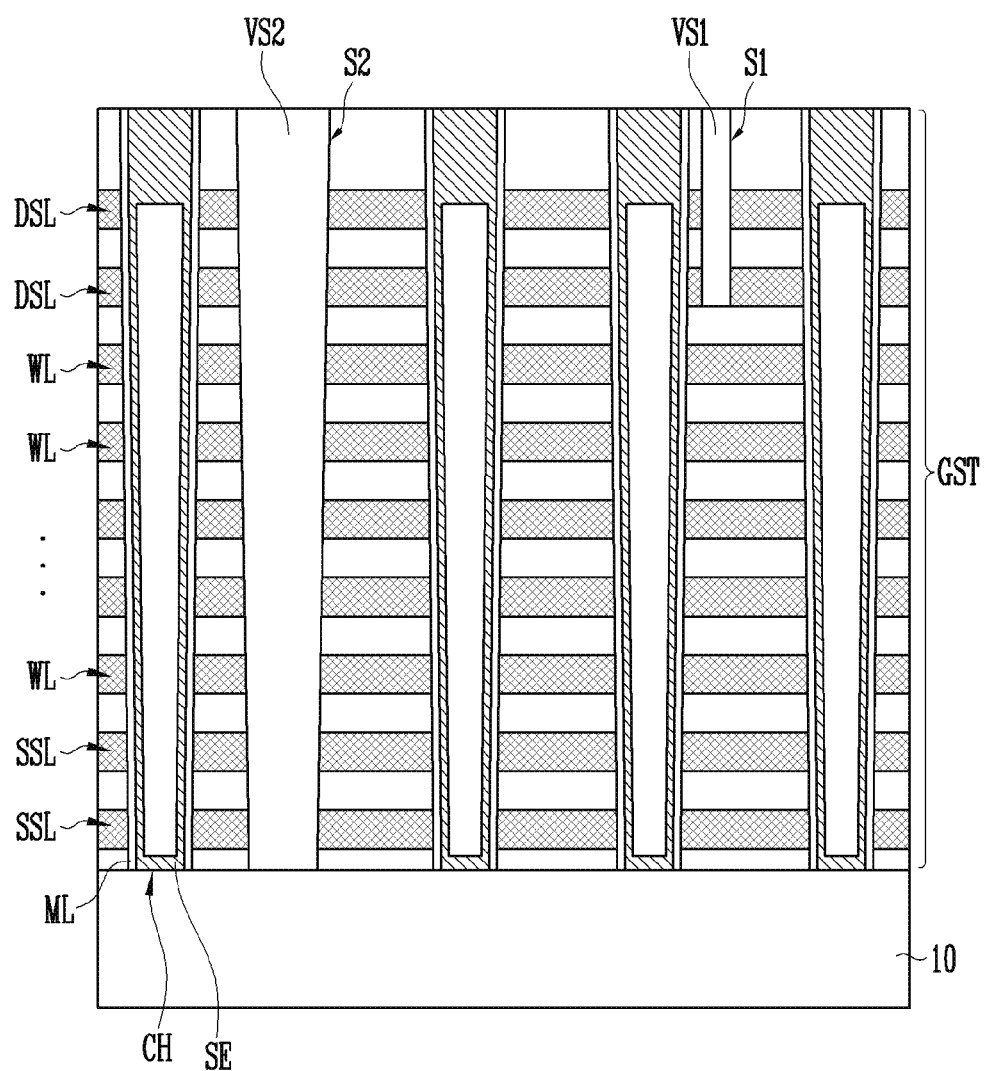
FIGS. 5A to 5C are sectional views illustrating various lower structures disposed under a gate stack in accordance with embodiments.
Figure 5B:
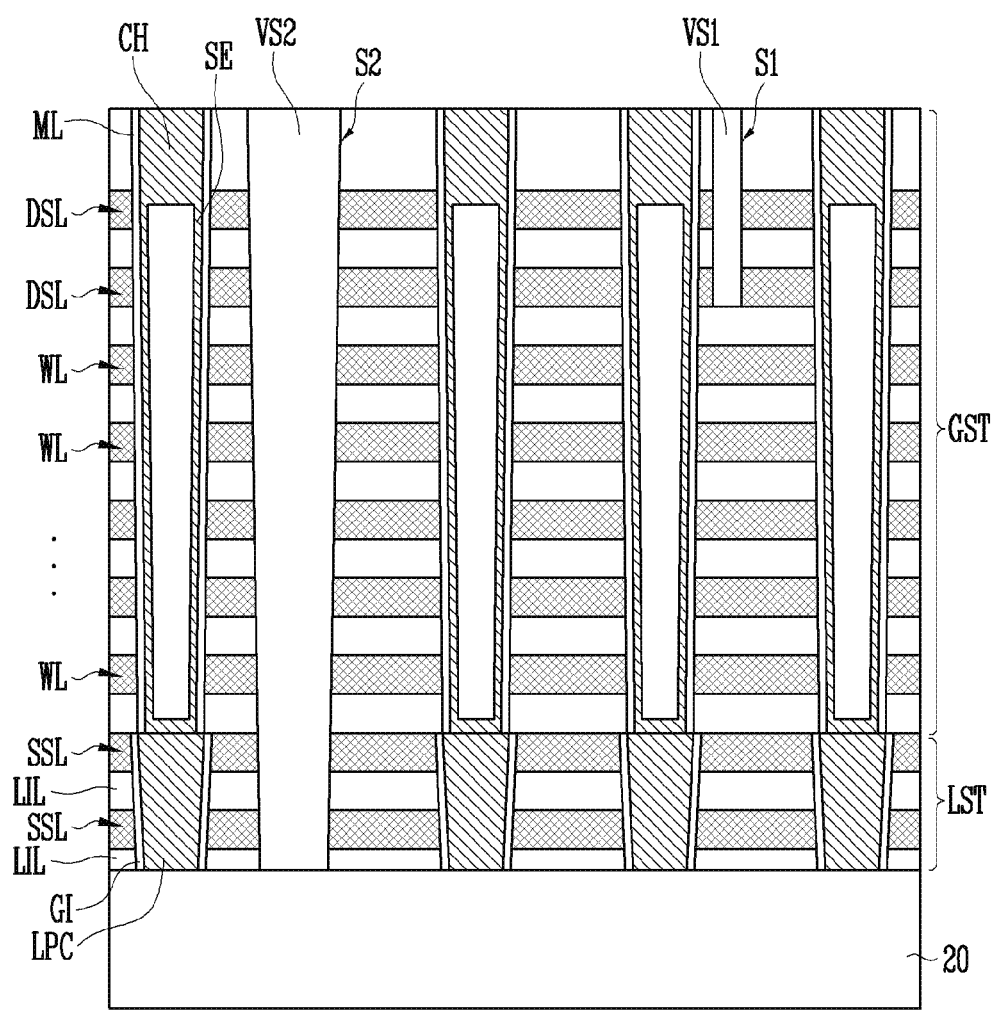
Figure 5C:
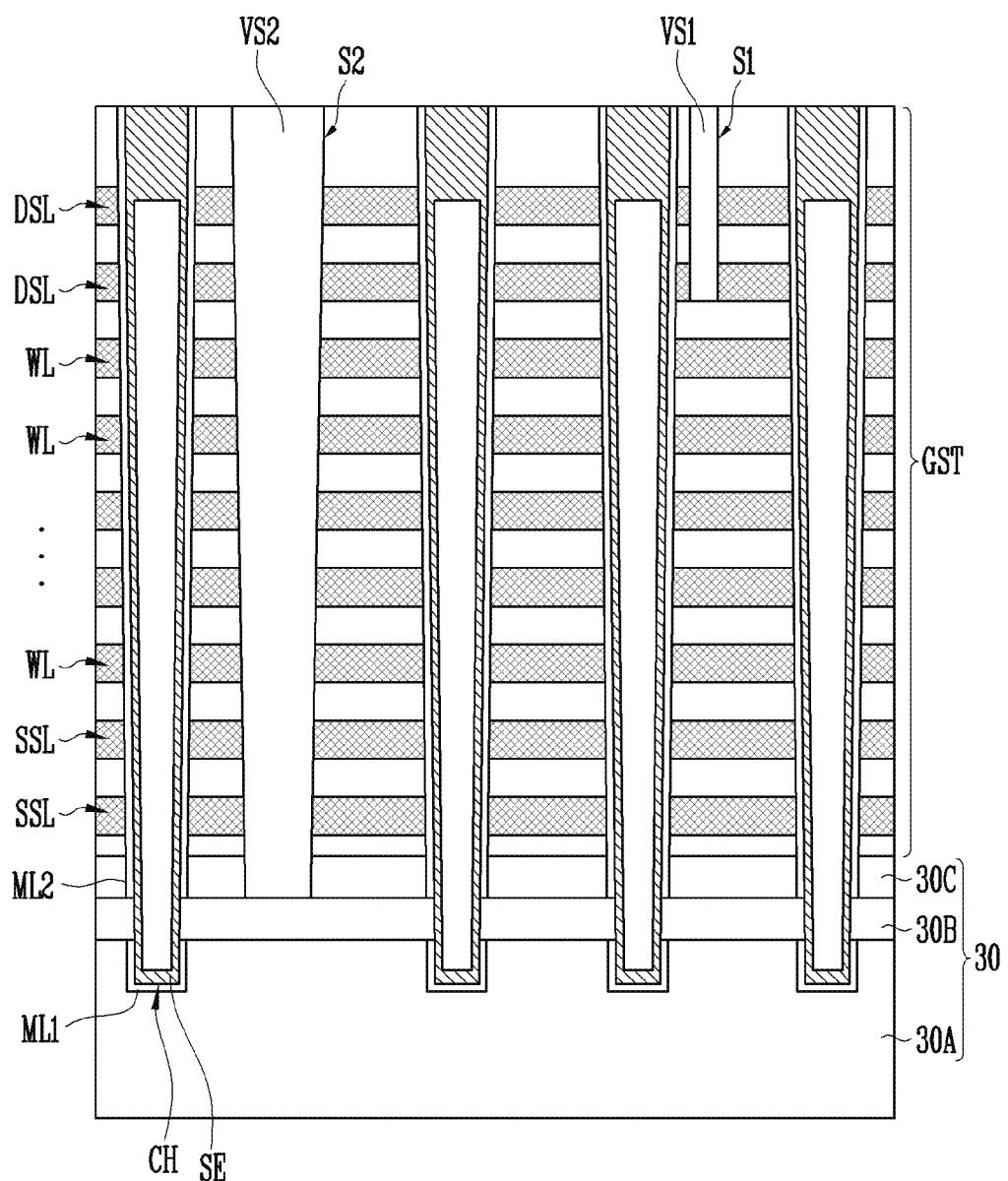

FIGS. 5A to 5C are sectional views illustrating various lower structures disposed under the gate stack in accordance with embodiments. The gate stack illustrated in FIG. 4A may be applied to a gate stack illustrated in each of FIGS. 5A to 5C. The gate stack illustrated in FIG. 4A may correspond to an upper end of the gate stack illustrated in each of FIGS. 5A to 5C. The channel structure illustrated in FIG. 4A may correspond to an upper end of a channel structure illustrated in each of FIGS. 5A to 5C.

Referring to FIGS. 5A to 5C, a doped semiconductor layer 10, 20, or 30 may be disposed under a gate stack GST. The doped semiconductor layer 10, 20, or 30 may be used as a source area. The doped semiconductor layer 10, 20, or 30 that is used as the source area may include a source dopant.

For example, the source dopant may include n-type impurities. As illustrated in FIGS. 5A and 5B, the doped semiconductor layer 10 or 20 may be formed of a single layer. As illustrated in FIG. 5C, the doped semiconductor layer 30 may include two or more layers 30A, 30B, and 30C which are successively stacked.

In an embodiment, each of the doped semiconductor layers 10, 20, and 30A illustrated in FIGS. 5A to 5C may be formed by injecting impurities into the surface of the substrate SUB illustrated in FIG. 1A, or may be formed by depositing at least one doped silicon layer on the substrate SUB. In an embodiment, each of the doped semiconductor layers 10, 20, and 30A to 30C illustrated in FIGS. 5A to 5C may be formed by forming an insulating layer on the substrate SUB illustrated in FIG. 1B and then depositing at least one doped silicon layer on the insulating layer.

Each of the gate stacks GST illustrated in FIGS. 5A to 5C may include the conductive patterns CP and the interlayer insulating layers ILD that have been described with reference to FIG. 4A.

In an embodiment, as illustrated in FIGS. 5A and 5C, any other structure might not be disposed between each of the gate stacks GST and the doped semiconductor layer 10 or 30. In an embodiment, the channel structure CH that passes through each of the gate stacks GST may come into direct contact with the doped semiconductor layer 10 or 30.

In an embodiment, as illustrated in FIG. 5B, a lower stack LST may be further formed between each of the gate stacks GST and the doped semiconductor layer 20. In an embodiment, the channel structure CH that passes through each of the gate stacks GST may be coupled to the doped semiconductor layer 20 via a lower channel structure LPC that passes through the lower stack LST.

Referring to FIG. 5A, the channel structure CH described with reference to FIG. 4A may extend to a top surface of the doped semiconductor layer 10. A bottom surface of the semiconductor layer SE included in the channel structure CH may come into direct contact with the top surface of the doped semiconductor layer 10. In an embodiment, the multilayer layer ML that surrounds the channel structure CH is penetrated by the semiconductor layer SE. The interlayer insulating layers ILD and the conductive patterns CP that have been described with reference to FIG. 4A may be alternately disposed on the doped semiconductor layer 10.

The conductive patterns of each of the gate stacks GST may be used as at least one source select line SSL, word lines WL, and drain select lines DSL. The drain select lines DSL may be divided by a first slit S1 and a second slit S2, and may correspond to the second patterns CP2 of the select stack SET illustrated in FIG. 4A. The word lines WL may correspond to the first patterns CP1 of the cell stack CET illustrated in FIG. 4A. The source select line SSL may be a conductive pattern that surrounds a lower end of the channel structure CH, and may be disposed on a single layer between the doped semiconductor layer 10 and the word lines WL or on each of two or more layers spaced apart from each other. The source select line SSL may be spaced apart from the doped semiconductor layer 10 and the word lines WL.

The gate stacks GST that are adjacent to each other may be separated from each other by the second slit S2. The drain select lines DSL that are included in each gate stack GST and spaced apart from each other with respect to the horizontal direction may be insulated from each other by a first vertical structure VS1 formed of insulating material. The first slit S1 may be filled with the first vertical structure VS1.

A second vertical structure VS2 with which the second slit S2 is filled may extend to the top surface of the doped semiconductor layer 10.

Referring to FIG. 5B, the channel structure CH described with reference to FIG. 4A may extend to a top surface of the lower channel structure LPC. A bottom surface of the semiconductor layer SE included in the channel structure CH may come into direct contact with the top surface of the lower channel structure LPC. In an embodiment, the multilayer layer ML that surrounds the channel structure CH is penetrated by the semiconductor layer SE.

A sidewall of the lower channel structure LPC may be surrounded by a gate insulating layer GI. The doped semiconductor layer 20 may come into contact with a bottom surface of the lower channel structure LPC. The semiconductor layer SE may be coupled to the doped semiconductor layer 20 via the lower channel structure LPC. The lower channel structure LPC may be formed by growing semiconductor material in a selective epitaxial growth scheme or depositing semiconductor material. The lower channel structure LPC may include n-type impurities. Impurities may be doped into the lower channel structure LPC in an in-situ scheme or an ion injection scheme.

The lower channel structure LPC may be surrounded by the lower stack LST. The lower stack LST may include at least one lower interlayer insulating layer LIL and at least one source select line SSL which are alternately stacked. The source select line SSL may be formed of the same material as that of the conductive patterns CP described with reference to FIG. 4A. The lower interlayer insulating layer LIL may be formed of the same material as that of the interlayer insulating layers ILD described with reference to FIG. 4A. The source select line SSL may be disposed on a single layer between the doped semiconductor layer 20 and each gate stack GST or on each of two or more layers spaced apart from each other.

The conductive patterns of each of the gate stacks GST may be used as word lines WL and drain select lines DSL. The drain select lines DSL may are divided by a first slit S1 and a second slit S2, and may correspond to the second patterns CP2 of the select stack SET illustrated in FIG. 4A. The word lines WL may correspond to the first patterns CP1 of the cell stack CET illustrated in FIG. 4A.

The gate stacks GST that are adjacent to each other may be separated from each other by the second slit S2. The second slit S2 and a second vertical structure VS2 with which the second slit S2 is filled may extend to the top surface of the doped semiconductor layer 20. Hence, the lower stack LST and another adjacent lower stack LST may be separated from each other by the second slit S2. The drain select lines DSL that are included in each gate stack GST and spaced apart from each other with respect to the horizontal direction may be insulated from each other by a first vertical structure VS1 with which the first slit S1 is filled.

Referring to FIG. 5C, the channel structure CH described with reference to FIG. 4A may extend into the doped semiconductor layer 30. The doped semiconductor layer 30 may include first to third layers 30A, 30B, and 30C which are successively stacked. Each of the first to third layers 30A, 30B, and 30C may be formed of a doped semiconductor layer. In an embodiment, each of the first to third layers 30A, 30B, and 30C may be formed of a doped silicon layer.

The channel structure CH may extend into the first layer 30A. The semiconductor layer SE of the channel structure CH may come into direct contact with the second layer 30B. The second layer 30B may protrude toward a sidewall of the semiconductor layer SE and divide the multilayer layer into a first multilayer pattern ML1 and a second multilayer pattern ML2. The third layer 30C may be omitted in some cases.

The interlayer insulating layers ILD and the conductive patterns CP that have been described with reference to FIG. 4A may be alternately disposed on the doped semiconductor layer 30. A source select line SSL, word lines WL, and drain select lines DSL of each of the gate stacks GST illustrated in FIG. 5C may be formed in the same structure as those described with reference to FIG. 5A.

The gate stacks GST that are adjacent to each other may be separated from each other by the second slit S2. The drain select lines DSL that are included in each gate stack GST and spaced apart from each other with respect to the horizontal direction may be insulated from each other by a first vertical structure VS1 with which the first slit S1 is filled. A second vertical structure VS2 with which the second slit S2 is filled may pass through the third layer 30C of the doped semiconductor layer 30 and extend to a top surface of the second layer 30B of the doped semiconductor layer 30.

According to the structure described with reference to FIGS. 5A to 5C, memory cells may be formed at intersections between the channel structure CH and the word lines WL. A source select transistor may be formed at an intersection between the source select line SSL and the channel structure CH illustrated in FIGS. 5A and 5C, or may be formed at an intersection between the source select line SSL and the lower channel structure LPC illustrated in FIG. 5B. Drain select transistors may be formed at intersections between the drain select lines DSL and the channel structure CH illustrated in FIGS. 5A to 5C.

An embodiment of the present disclosure may provide a manufacturing method in which a semiconductor device manufacturing process is performed such that introduction of conductive material for the conductive patterns or insulating material for the interlayer insulating layers is prevented from being blocked by the first vertical structure with which the first slit is filled, thus facilitating the semiconductor device manufacturing process.

FIGS. 6A to 6F are sectional views illustrating a method of manufacturing a semiconductor device in accordance with an embodiment. FIGS. 6A to 6F are sectional views taken along line I-I' illustrated in each of FIGS. 3A and 3B by process steps.

Figure 6A:
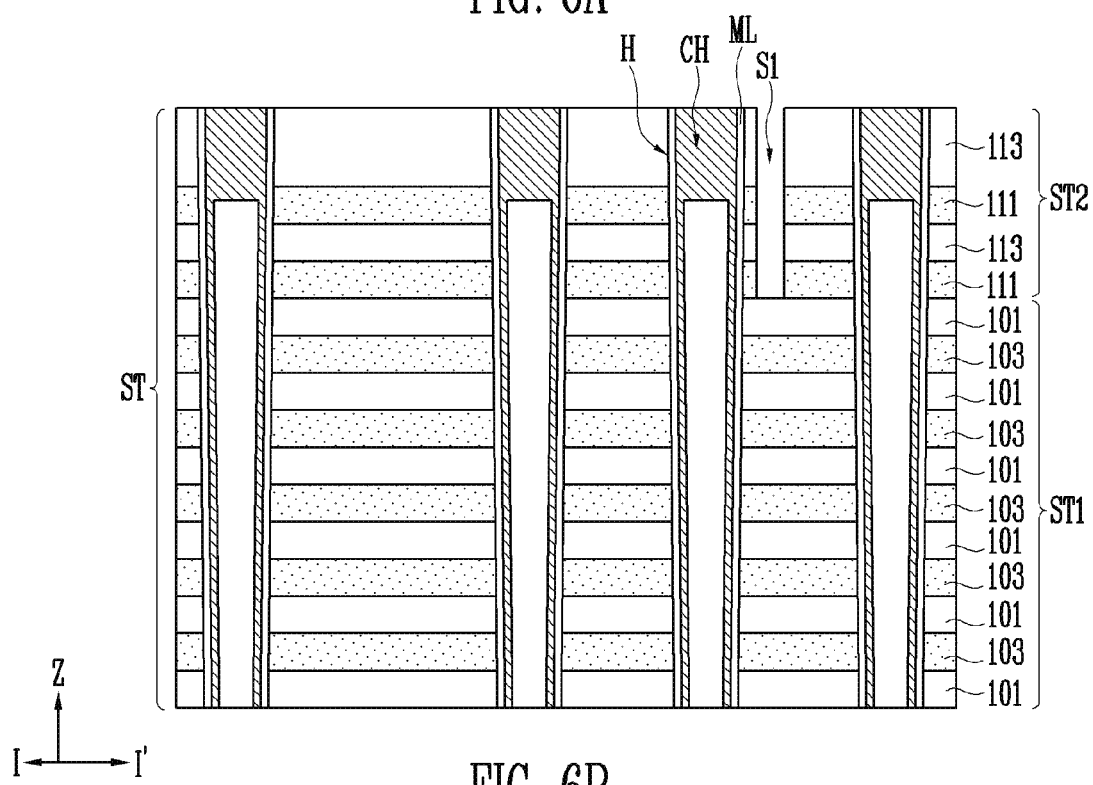
FIGS. 6A to 6F are sectional views illustrating a method of manufacturing a semiconductor device in accordance with an embodiment.

Referring to FIG. 6A, the stack ST that is penetrated by the channel structures CH is formed. The stack ST may be formed on a doped semiconductor layer. The step of forming the stack ST may include the step of forming a first stack ST1, the step of forming a second stack ST2 over the first stack ST1, and the step of forming the channel structures CH that pass through the second stack ST2 and the first stack ST1.

The first stack ST1 may include first material layers 101 and second material layers 103 which are alternately stacked in the first direction Z. The first material layers 101 may be formed of material different from that of the second material layers 103.

The second stack ST2 may be formed by alternately stacking a third material layer 111 and a fourth material layer 113 in the first direction Z. The second stack ST2 may have a stacked structure formed of two or more layers including at least one third material layer 111 and at least one fourth material layer 113. For example, the second stack ST2 may include a pair of layers including the third material layer 111 and the fourth material layer 113, or may include a plurality of third material layers 111 and a plurality of fourth material layers 113.

In an embodiment, the first material layer 101 may be disposed on an uppermost layer of the first stack ST1, and the third material layer 111 may be disposed on a lowermost layer of the second stack ST2. The third material layer 111 may be formed of the same material as that of the second material layer 103. The fourth material layer 113 may be formed of the same material as that of the first material layer 101.

In an embodiment, the first material layer 101 and the fourth material layer 113 may be formed as insulating material for interlayer insulating layers. The second material layer 103 and the third material layer 111 may be sacrificial layers having an etching rate different from that of the first material layer 101 and the fourth material layer 113. For example, the first material layer 101 and the fourth material layer 113 may be formed of silicon oxide layers, and the second material layer 103 and the third material layer 111 may be formed of silicon nitride layers. In an embodiment, during a subsequent process, the second material layer 103 and the third material layer 111 may be replaced with conductive patterns, and the first material layer 101 and the fourth material layer 113 may remain as interlayer insulating layers.

In an embodiment, the second material layer 103 and the third material layer 111 may be formed as conductive material for conductive patterns. The first material layer 101 and the fourth material layer 113 may be sacrificial layers having an etching rate different from that of the second material layer 103 and the third material layer 111. For example, the second material layer 103 and the third material layer 111 may be formed of doped silicon layers, and the first material layer 101 and the fourth material layer 113 may be formed of undoped silicon layers. In an embodiment, during a subsequent process, the second material layer 103 and the third material layer 111 may remain as conductive patterns, and the first material layer 101 and the fourth material layer 113 may be replaced with interlayer insulating layers.

The step of forming the channel structures CH may include the step of forming holes H which pass through the second stack ST2 and the first stack ST1, and the step of filling the holes H with the channel structures CH. The step of forming the channel structures CH may further include the step of forming a multilayer layer ML on a surface of each of the holes H before the channel structures CH are formed. In an embodiment, the channel structures CH may be formed on the multilayer layers ML. Each of the channel structures CH and the multilayer layer ML may have the same structures as those described with reference to FIG. 4B.

Subsequently, the first slits S1 which are arrayed as illustrated in FIG. 3A may be formed by etching the second stack ST2. Each of the first slits S1 may extend in the second horizontal direction Y illustrated in FIG. 3A. Each of the first slits S1 may be formed to a first depth to pass through the second stack ST2 but not to penetrate into the first stack ST1. As illustrated in FIG. 3A, a plurality of rows of channel structures CH may be disposed on opposite sides of each of the first slits S1.

Figure 6B:
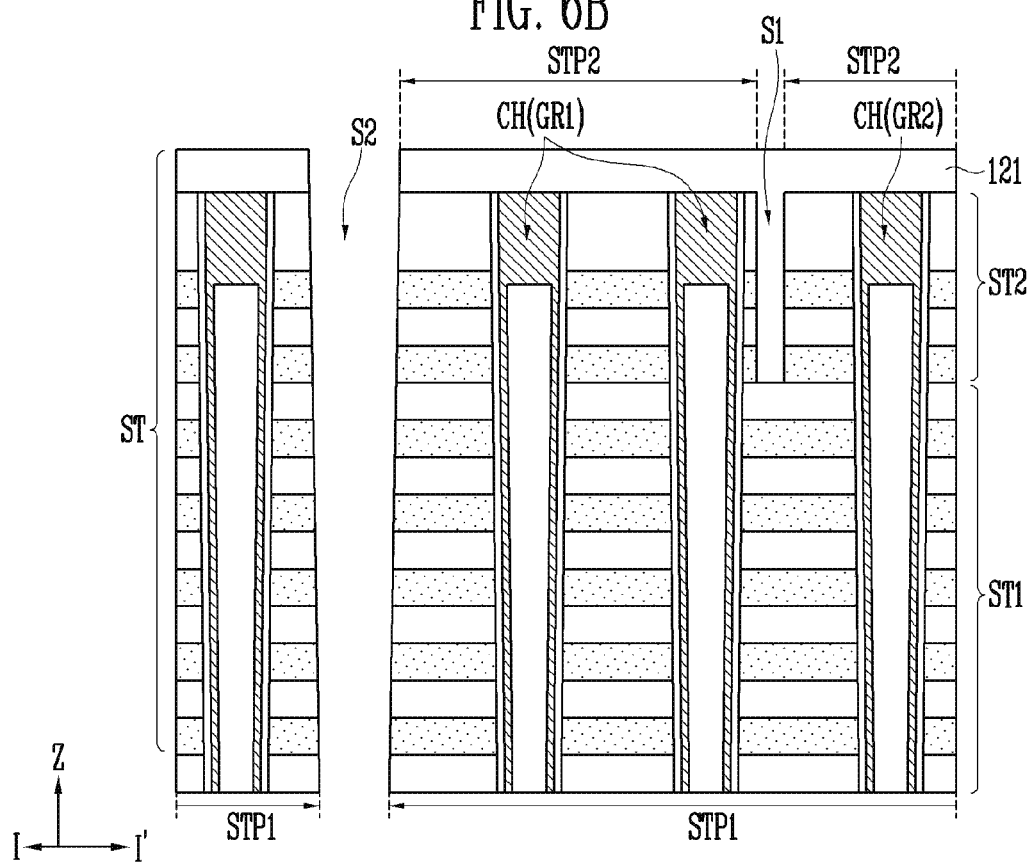

Referring to FIG. 6B, a mask pattern 121 with which the first slits S1 are filled may be formed over the stack ST. The step of forming the mask pattern 121 may include the step of forming a mask layer, and the step of patterning the mask layer through a photolithography process. In an embodiment, the mask layer may be formed by stacking a carbon layer and a silicon oxynitride (SiON) layer. In an embodiment, the mask layer may be a spin-on-carbon (SOC) layer.

Thereafter, the second slits S2 arrayed as illustrated in FIGS. 3A and 3B may be formed by etching the stack ST through an etching process using the mask pattern 121 as an etching barrier.

Each of the second slits S2 may be formed to a second depth to pass through the second stack ST2 and the first stack ST1. The second depth of each of the second slits S2 is greater than the first depth of each of the first slits S1. In other words, the first depth is less than the second depth.

The first stack ST1 may be divided into first stack patterns STP1 by the second slits S2. The second stack ST2 may be divided into second stack patterns STP2 by the second slits S2 and the first slits S1. As illustrated in FIG. 3A, at least one of the first slits S1 may be disposed between the second slits S2 that are adjacent to each other in the first horizontal direction X. In an embodiment, one first slit S1 may be formed between the second slits S2 that are adjacent to each other in the first horizontal direction X. In an embodiment, two or more first slits S1 may be formed between the second slits S2 that are adjacent to each other in the first horizontal direction X.

Each of the first stack patterns STP1 may horizontally extend under the corresponding first slit S1 and overlap with the first slit S1. The second stack patterns STP2 that are disposed on and overlapped with each first stack pattern STP1 may be separated from each other by at least one first slit S1 that overlaps with the first stack pattern STP1. The channel structures CH that are shared by each of the first stack patterns STP1 may be divided into channel groups GR1 and GR2 that are surrounded by different second stack patterns STP2.

In an embodiment, the second stack ST2 may be penetrated by the first slits S1 and the second slits S2, and the first stack ST1 may be penetrated by the second slits S2 but not penetrated by the first slits S1. Consequently, the number of slits that pass through the second stack ST2 may be greater than the number of slits that pass trough the first stack ST1. The number of second stack patterns STP2 may be greater than that of the first stack patterns STP1. The width of each second stack pattern STP2 may be less than that of each first stack pattern STP1.

As illustrated in FIG. 3A, one or more rows of channel structures CH may be disposed between the first slit S1 and the second slit S2 that are adjacent to each other. As illustrated in FIG. 3A, one or more rows of channel structures CH may be disposed between the first slits S1 that are adjacent to each other.

Figure 6C:
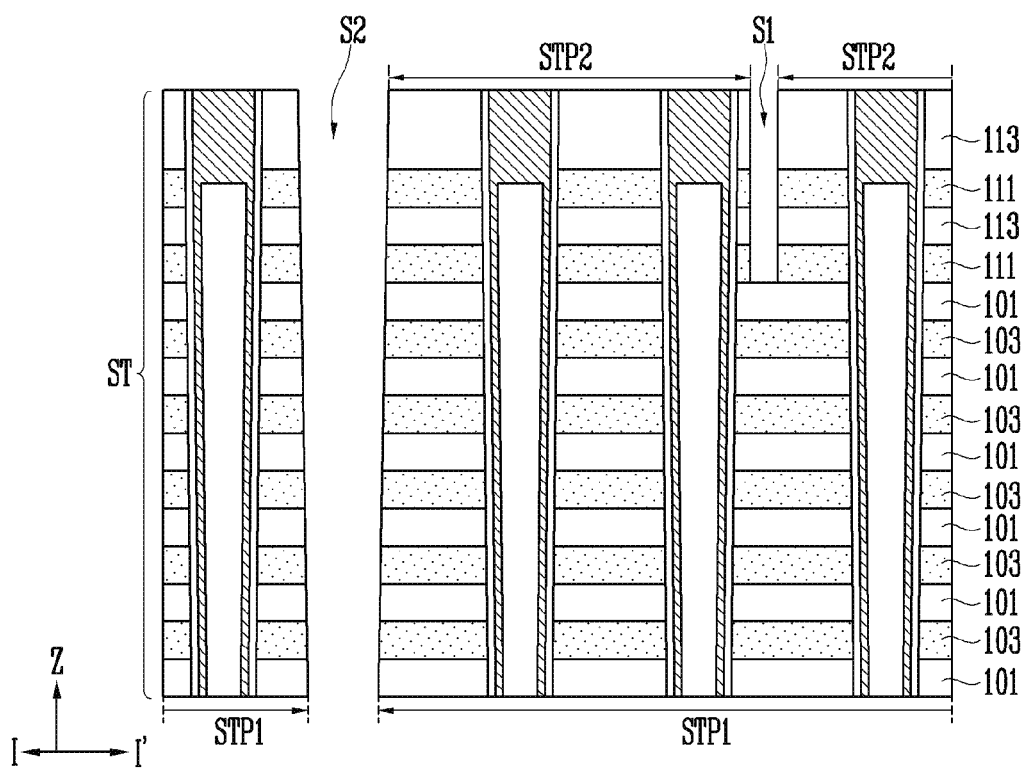

Referring to FIG. 6C, the mask pattern 121 described with reference to FIG. 6B may be removed to open the first slits S1. Thereby, the first to fourth material layers 101, 103, 111, and 113 of the stack ST are exposed through the first slits S1 and the second slits S2 which have different depths.

Figure 6D:
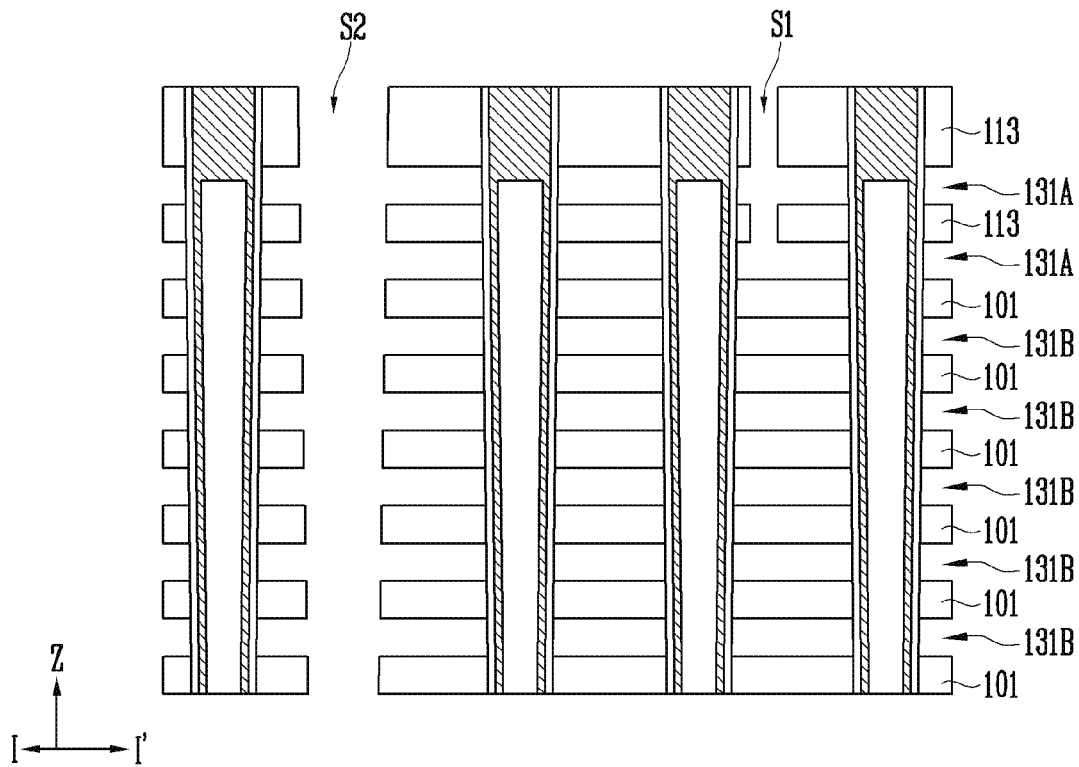

Referring to FIG. 6D, the sacrificial layers may be removed through the first slits S1 and the second slits S2 which have different depths. Areas from which the sacrificial layers have been removed may be defined as interlayer spaces 131A and 131B.

For example, the second and third material layers 103 and 111 that have been exposed during the process of FIG. 6C may be removed through the first slits S1 and the second slits S2. In an embodiment, the interlayer spaces 131A and 131B may open between the first material layers 101 that are adjacent to each other in the first direction Z, between the first material layer 101 and the fourth material layer 113 that are adjacent to each other in the first direction Z, and between the fourth material layers 113 that are adjacent to each other in the first direction Z. However, the present disclosure is not limited thereto. Although not illustrated, in the case where the first material layers 101 and the fourth material layers 113 that are illustrated in FIG. 6C are sacrificial layers, the first material layers 101 and the fourth material layers 113 may be removed.

The interlayer spaces 131A and 131B may be divided into first interlayer spaces 131A coupled to the first slits S1, and second interlayer spaces 1316 spaced apart from the first slits S1.

In a comparative example, after the first slits S1 have been filled with insulting material, the sacrificial layers may be removed through the second slits S2. In this case, due to the insulating material with which the first slits S1 are filled, sacrificial layers might not be removed from the spaces between the first slits S1 that are adjacent to each other, as illustrated in FIG. 3A. In an embodiment of the present disclosure, the sacrificial layers are removed while all of the first and second slits S1 and S2 open. Hence, in an embodiment of the present disclosure, even if the first slits S1 are adjacent to each other, the sacrificial layers that are between the first slits S1 may be easily removed.

Figure 6E:
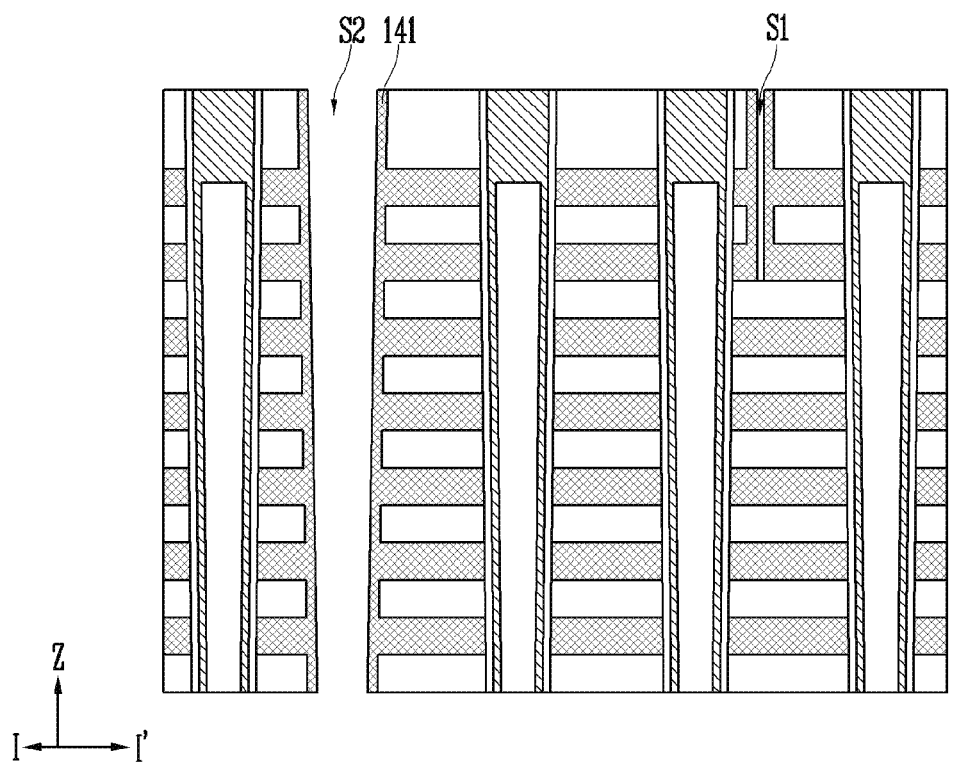

Referring to FIG. 6E, the interlayer spaces 131A and 1316 illustrated in FIG. 6D may be filled with a fifth material layer 141 through the first slits S1 and the second slits S2.

In a comparative example, after the first slits S1 have been filled with insulting material, the fifth material layer 141 may be formed through the second slits S2. In this case, due to the insulating material with which the first slits S1 are filled, the fifth material layer 141 might not be drawn into the spaces between the first slits S1 that are adjacent to each other, as illustrated in FIG. 3A. In an embodiment of the present disclosure, the fifth material layer 141 is formed while all of the first and second slits S1 and S2 open. Hence, in an embodiment of the present disclosure, even if the first slits S1 are adjacent to each other, the fifth material layer 141 may be easily drawn into the spaces between the first slits S1.

In an embodiment, in the case where the interlayer spaces 131A and 131B shown in FIG. 6D from which the second and third material layers 103 and 111 shown in FIG. 6C have been removed are filled with the fifth material layer 141, the fifth material layer 141 may be conductive material. The conductive material may include any one of metal, metal silicide, metal nitride, and a doped silicon layer. To achieve the low-resistance wiring, the conductive material may include low-resistance metal such as tungsten. For example, as illustrated in FIG. 3A, even if the channel structures CH may be divided into the plurality of channel groups (e.g., GR1 to GR4) by the first slits S1 disposed between the second slits S2 that are adjacent to each other, the channel groups (GR2 and GR3) between the first slits S1 may be surrounded by tungsten by using the first slits S1 as a passage to introduce tungsten.

Although not illustrated, in an embodiment, interlayer spaces from which the first and fourth materials formed as sacrificial layers have been removed may be filled with the fifth material layer 141. In an embodiment, the fifth material layer 141 may be insulating material for interlayer insulating layers.

The fifth material layer 141 may be formed with a thickness such that a central area of each of the first and second slits S1 and S2 remains open.

Figure 6F:
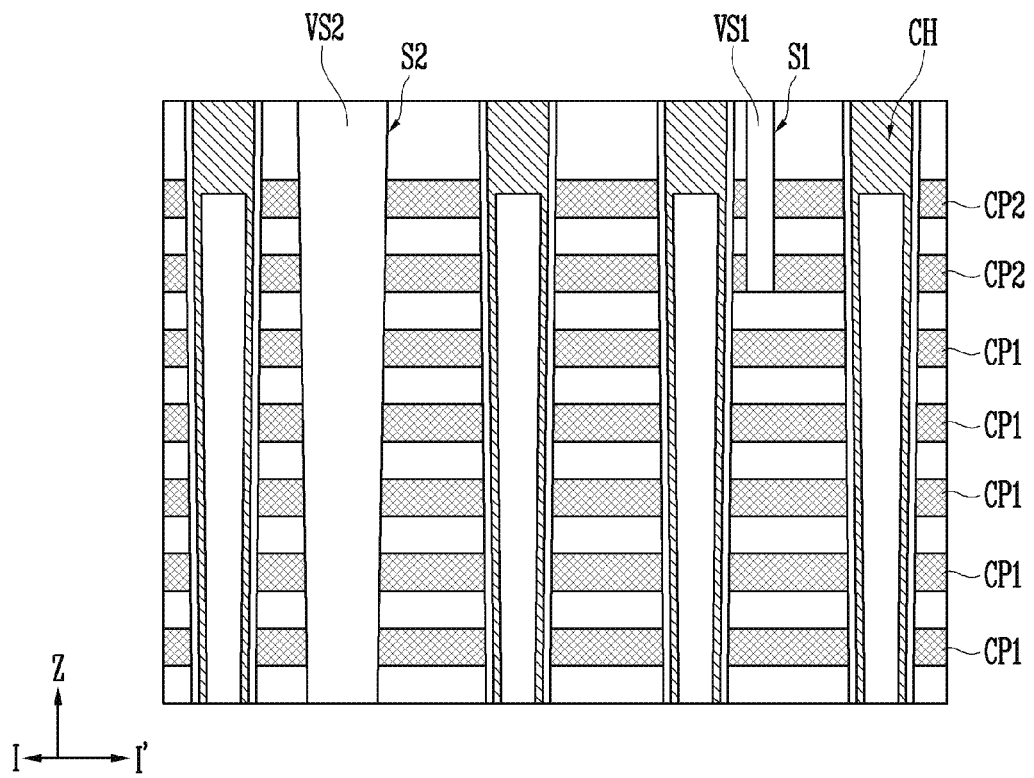

Referring to FIG. 6F, the fifth material layer 141 illustrated in FIG. 6E may be etched so that the fifth material layer 141 may be divided into a plurality of line patterns. In an embodiment, in the case where the fifth material layer 141 is formed of conductive material, the line patterns may be conductive patterns CP1 and CP2. The conductive patterns CP1 and CP2 may correspond to the conductive patterns CP1 and CP2 described with reference to FIG. 4A. The conductive patterns CP1 and CP2 may include first patterns CP1 which are charged into areas from which the second material layers 103 of the first stack patterns STP1 illustrated in FIG. 6C have been removed, and second patterns CP2 which are charged into areas from which the third material layers 111 of the second stack patterns STP2 illustrated in FIG. 6C have been removed. The first patterns CP1 may be used as the word lines WL and the source select line SSL illustrated in FIGS. 5A to 5C. The second patterns CP2 may be used as the drain select lines DSL illustrated in FIGS. 5A to 5C.

Thereafter, the first vertical structure VS1 with which each of the first slits S1 is filled, and the second vertical structure VS2 with which each of the second slits S2 is filled may be formed.

In an embodiment, to more easily replace the sacrificial layers between the adjacent first slits S1 with the line patterns, at least one of a line-shaped opening and a hole-shaped opening between the first slits S1 may be formed simultaneously with the first slits S1. The at least one of the line-shaped opening and the hole-shaped opening, along with the first slits S1, may be used as a passage needed to replace the sacrificial layers with the line patterns.

In various embodiments of the present disclosure, while a first slit that passes through portion of a stack opens, sacrificial layers of the stack may be replaced with line patterns through a second slit that divides the stack into stack patterns. Hence, the first slit may be used as a passage needed to replace the sacrificial layers with the line patterns. Consequently, in various embodiments of the present disclosure, the sacrificial layers of the stack may be easily replaced with the line patterns.

Figure 7:
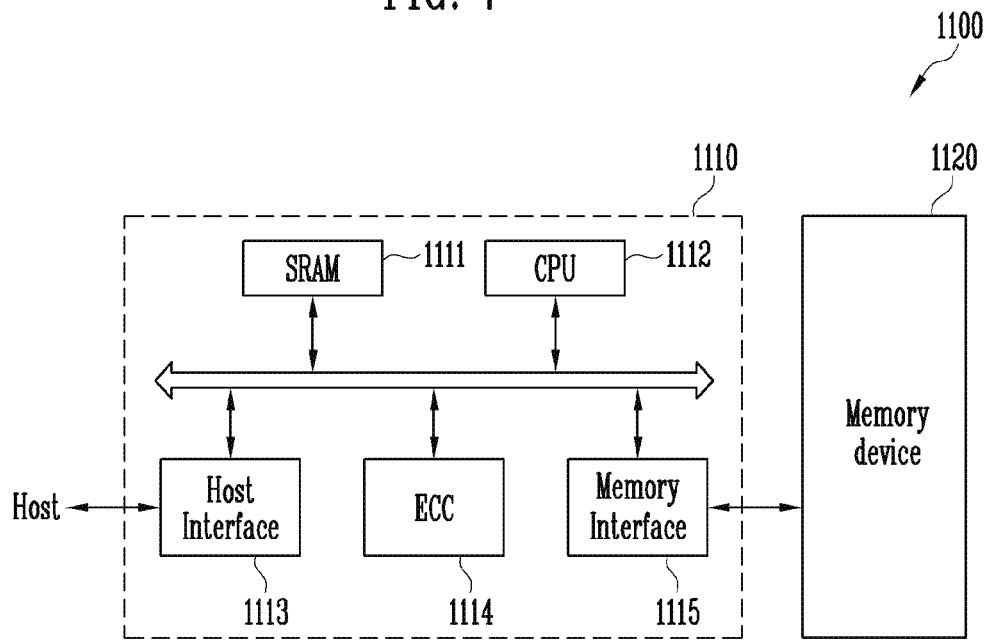
FIG. 7 is a block diagram illustrating the configuration of a memory system in accordance with an embodiment.

FIG. 7 is a block diagram illustrating the configuration of a memory system 1100 in accordance with an embodiment. The memory system 1100 may include the semiconductor devices discussed above.

Referring FIG. 7, the memory system 1100 in accordance with an embodiment includes a memory device 1120 and a memory controller 1110.

The memory device 1120 may be a multi-chip package formed of a plurality of memory chips.

The memory controller 1110 may control the memory device 1120, and include a static random access memory (SRAM) 1111, a CPU 1112, a host interface 1113, an error correction code (ECC) 1114, and a memory interface 1115. The SRAM 1111 may be used as an operating memory of the CPU 1112. The CPU 1112 may perform overall control operations for data exchange of the memory controller 1110. The host interface 1113 may be provided with a data interchange protocol of a host coupled with the memory system 1100. Furthermore, the ECC 1114 may detect and correct an error included in the data that is read from the memory device 1120, and the memory interface 1115 may interface with the memory device 1120. In addition, the memory controller 1110 may further include a read only memory (ROM) or the like that stores code data for interfacing with the host.

The above-described memory system 1100 may be a memory card or a solid state disk (SSD) equipped with the memory device 1120 and the memory controller 1110. For example, when the memory system 1100 is an SSD, the memory controller 1110 may communicate with an external device (e.g., a host) via one of various interface protocols, such as a universal serial bus (USB), a multimedia card (MMC), a peripheral component interconnection-express (PCI-E), a serial advanced technology attachment (SATA), a parallel advanced technology attachment (PATA), a small computer small interface (SCSI), an enhanced small disk interface (ESDI), and an integrated drive electronics (IDE) protocols.

Figure 8:
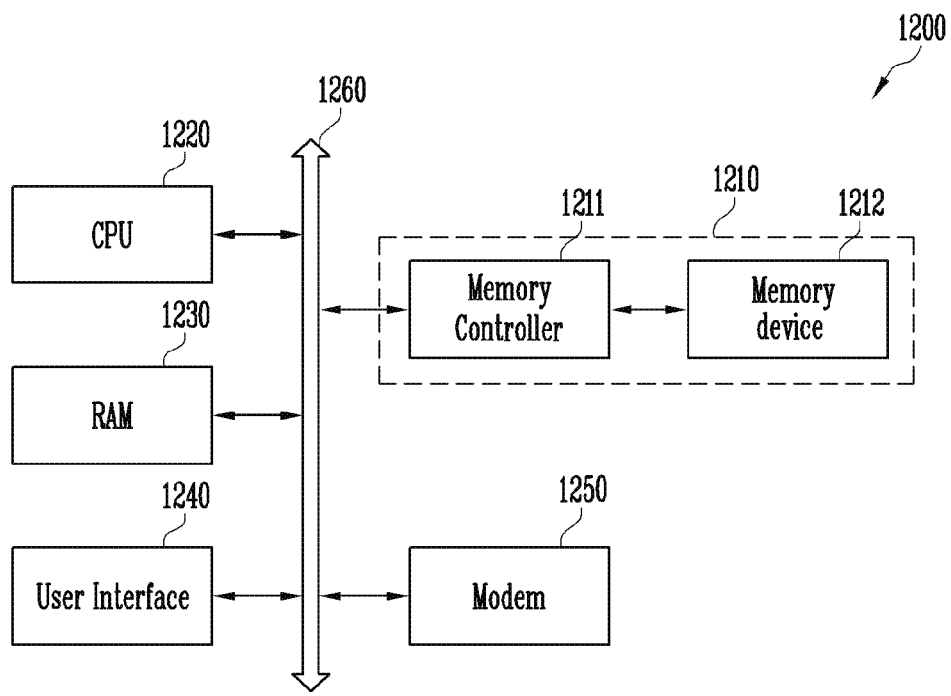
FIG. 8 is a block diagram illustrating the configuration of a computing system in accordance with an embodiment.

FIG. 8 is a block diagram illustrating the configuration of a computing system 1200 in accordance with an embodiment. The computing system 1200 may include the semiconductor devices discussed above.

Referring to FIG. 8, the computing system 1200 in accordance with an embodiment may include a CPU 1220, a random access memory (RAM) 1230, a user interface 1240, a modem 1250, and a memory system 1210 that are electrically coupled to a system bus 1260. Furthermore, if the computing system 1200 is a mobile device, it may further include a battery for supplying an operating voltage to the computing system 1200. An application chip set, a camera image processor CIS, a mobile DRAM and the like may be further included.

The embodiments disclosed in the present specification and the drawings just aims to help those with ordinary knowledge in this art more clearly understand the present disclosure rather than aiming to limit the bounds of the present disclosure. It is obvious to those skilled in the art that various implementations based on the technological spirit of the present disclosure are possible in addition to the disclosed embodiments.

Unless otherwise defined, all terms including technical and scientific terms used herein have the same meaning as commonly understood by one of ordinary skill in the art to which the present disclosure belongs. It will be further understood that terms used herein should be interpreted as having a meaning that is consistent with their meaning in the context of this specification and the relevant art and will not be interpreted in an idealized or overly formal sense unless expressly so defined herein.

What is claimed is:

1. A method of manufacturing a semiconductor device, comprising:
    forming a stack;
    forming channel groups passing through the stack, wherein each of the channel groups includes a plurality of channel structures passing through the stack;
    forming a first slit penetrating from a top surface of the stack into the stack to a first depth, and a second slit penetrating from the top surface of the stack into the stack to a second depth, wherein the first slit and the second slit are disposed between the channel groups;
    removing sacrificial layers of the stack through the first slit and the second slit that have different depths; and
    filling areas from which the sacrificial layers have been removed with line patterns separated from each other by the first slit and the second slit.

2. The method according to claim 1,
    wherein the stack comprises interlayer insulating layers and the sacrificial layers that are alternately stacked,
    wherein the interlayer insulating layers and the sacrificial layers are divided into a first stack pattern and second stack patterns,
    wherein the first stack pattern is disposed under the first slit and extends to overlap with the first slit, and
    wherein the second stack patterns are disposed over the first stack pattern and separated from each other by the first slit.

3. The method according to claim 2, wherein the line patterns comprise:
    word lines formed in areas from which first sacrificial layers included in the first stack pattern among the sacrificial layers have been removed; and
    first select lines formed in areas from which second sacrificial layers included in the second stack patterns among the sacrificial layers have been removed.

4. The method according to claim 2, wherein the line patterns comprise:
    second select lines formed in areas from which first sacrificial layers included in the first stack pattern among the sacrificial layers have been removed.

5. The method according to claim 2,
    wherein two or more of the channel groups are shared by the first stack pattern, and
    wherein the two or more of the channel groups are surrounded by the second stack patterns, respectively.

6. The method according to claim 1, wherein each of the line patterns is formed of conductive material.

7. The method according to claim 1, wherein the second slit penetrates all of the sacrificial layers.

8. The method according to claim 1, wherein the first depth is less than the second depth.

9. The method according to claim 1, wherein each of the line patterns includes tungsten.

10. A method of manufacturing a semiconductor device, comprising:
    forming a first stack;
    forming a second stack over the first stack;
    forming channel groups passing through the first stack and the second stack, wherein each of the channel groups includes a plurality of channel structures passing through the first stack and the second stack;
    forming slits passing through at least one of the first stack and the second stack such that a number of slits passing through the second stack is greater than a number of slits passing through the first stack, wherein the slits are disposed between the channel groups;
    removing first sacrificial layers of the first stack and second sacrificial layers of the second stack through the slits; and
    filling areas from which the first sacrificial layers and the second sacrificial layers have been removed with line patterns through the slits.

11. The method according to claim 10,
    wherein the first stack comprises first interlayer insulating layers and the first sacrificial layers that are alternately stacked,
    wherein the second stack comprises second interlayer insulating layers and the second sacrificial layers that are alternately stacked.

12. The method according to claim 10, wherein the line patterns are formed of conductive material.

13. The method according to claim 10,
    wherein each of the channel groups includes one or more rows of the channel structures.

14. The method according to claim 10, wherein the slits comprise:
    first slits passing through the second stack; and
    second slits disposed adjacent to each other with at least one of the first slits therebetween, and the second slits passing through the second stack and the first stack.

15. The method according to claim 10, wherein the line patterns include tungsten.

* * * * *